(12) United States Patent
Hauer et al.

(10) Patent No.: US 8,354,893 B2
(45) Date of Patent: Jan. 15, 2013

(54) IMPEDANCE-MATCHING TRANSFORMERS FOR RF DRIVEN $CO_2$ GAS DISCHARGE LASERS

(75) Inventors: Frederick W. Hauer, Windsor, CT (US); Patrick T. Tracy, Bolton, CT (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 13/589,447

(22) Filed: Aug. 20, 2012

(65) Prior Publication Data

US 2012/0307852 A1    Dec. 6, 2012

Related U.S. Application Data

(62) Division of application No. 12/786,199, filed on May 24, 2010.

(51) Int. Cl.
*H03H 7/38* (2006.01)
(52) U.S. Cl. .......................................................... 333/33
(58) Field of Classification Search .................... 333/33, 333/32
See application file for complete search history.

(56) References Cited

U.S. PATENT DOCUMENTS

| | | | |
|---|---|---|---|
| 4,013,974 A | 3/1977 | Quine | |
| 4,311,965 A | 1/1982 | Jones | |
| 4,350,958 A | 9/1982 | Pagnamenta | |
| 4,774,481 A | 9/1988 | Edwards et al. | |
| 4,806,944 A | 2/1989 | Jacomb-Hood | |
| 4,885,557 A | 12/1989 | Barczys | |
| 5,008,894 A | 4/1991 | Laakmann | |
| 5,040,184 A | 8/1991 | Murray | |
| 5,123,028 A | 6/1992 | Hobart et al. | |
| 5,264,810 A | 11/1993 | Sager et al. | |
| 5,311,196 A | 5/1994 | Hanson et al. | |
| 5,434,881 A | 7/1995 | Welsch et al. | |
| 5,543,751 A | 8/1996 | Stedman et al. | |
| 5,602,865 A | 2/1997 | Laakmann | |
| 5,712,592 A | 1/1998 | Stimson et al. | |
| 5,771,026 A | 6/1998 | Stengel, Jr. | |
| 6,018,280 A | 1/2000 | Makanvand | |
| 6,097,267 A | 8/2000 | Hampel | |
| 6,323,742 B1 | 11/2001 | Ke | |
| 6,384,540 B1 | 5/2002 | Porter, Jr. et al. | |
| 6,489,859 B1 | 12/2002 | Tahara et al. | |
| 6,559,737 B1 | 5/2003 | Nagra et al. | |
| 6,778,037 B1 | 8/2004 | Salmela et al. | |

(Continued)

FOREIGN PATENT DOCUMENTS

EP    0418538 A1    3/1991

(Continued)

OTHER PUBLICATIONS

Notice of Allowance received for U.S. Appl. No. 11/711,192, mailed on Apr. 15, 2010, 6 pages.

(Continued)

*Primary Examiner* — Stephen Jones
(74) *Attorney, Agent, or Firm* — Morrison & Foerster LLP

(57) ABSTRACT

In a $CO_2$ gas discharge laser energized by a radio frequency (RF) power source a transformer having selectively variable output impedance is used to match output impedance of the power source to the impedance of discharge electrodes of the laser. A similar transformer can be used to impose a selective variable phase-shift on the RF power from the source. The variable impedance transformer can also be used for impedance matching between amplifier stages in the power source.

13 Claims, 6 Drawing Sheets

U.S. PATENT DOCUMENTS

| | | | |
|---|---|---|---|
| 6,788,722 | B1 | 9/2004 | Kennedy et al. |
| 6,803,837 | B2 | 10/2004 | Ishida et al. |
| 6,999,490 | B2 | 2/2006 | Kennedy et al. |
| 7,164,903 | B1 | 1/2007 | Cliff et al. |
| 7,233,217 | B2 | 6/2007 | Phillips et al. |
| 7,514,994 | B2 | 4/2009 | Fraysse |
| 7,540,779 | B2 | 6/2009 | Papanide et al. |
| 7,558,308 | B2 | 7/2009 | Shackleton et al. |
| 7,605,673 | B2 | 10/2009 | Robotham, Jr. et al. |
| 7,755,452 | B2 | 7/2010 | Knickerbocker et al. |
| 2010/0316084 | A1 | 12/2010 | Hauer et al. |

FOREIGN PATENT DOCUMENTS

| | | |
|---|---|---|
| EP | 0858124 A1 | 8/1998 |
| EP | 1939980 A1 | 7/2008 |
| JP | 4-23605 A | 1/1992 |
| JP | 7-131096 A | 5/1995 |
| JP | 11-97952 A | 4/1999 |
| JP | 2001-512619 A | 8/2001 |
| JP | 2005-130013 A | 5/2005 |
| WO | 2009/060213 A1 | 5/2009 |

OTHER PUBLICATIONS

Non Final Office Action received for U.S. Appl. No. 12/482,341, mailed on Sep. 27, 2010, 12 pages.

Notice of Allowance received for U.S. Appl. No. 12/482,341, mailed on Nov. 19, 2010, 6 pages.

Non-Final Office Action received for U.S. Appl. No. 12/786,199, mailed on Apr. 23, 2012, 27 pages.

Notice of Allowance received for U.S. Appl. No. 13/090,885, mailed on Feb. 23, 2012, 7 pages.

Notice of Allowance received for U.S. Appl. No. 13/090,885, mailed on Jan. 19, 2012, 19 pages.

Office Action received for Japanese Patent Application No. 2009-551659, mailed on Jul. 3, 2012, 12 Pages. (8 pages of English translation and 4 pages of Office Action).

Office Action received for Japanese Patent Application No. 2009-551659 mailed on Oct. 11, 2011, 4 pages of English translation only.

International Preliminary Report on Patentability received for PCT Patent Application No. PCT/US2008/00908, issued on Sep. 1, 2009, 6 pages.

International Search Report received for PCT Patent Application No. PCT/US2008/00908, mailed on Jun. 26, 2008, 3 pages.

International Preliminary Report on Patentability received for PCT Patent Application No. PCT/US2010/037910, mailed on Dec. 22, 2011, 12 pages.

International Search Report and Written Opinion received for PCT Patent Application No. PCT/US2010/037910, mailed on Mar. 22, 2011, 18 pages.

Invitation to Pay Additional Fees and Partial Search Report received for PCT Patent Application No. PCT/US2010/037910, mailed on Oct. 8, 2010, 5 pages.

International Search Report and Written Opinion received for PCT Patent Application No. PCT/US2011/037324, mailed on Aug. 22, 2011, 15 pages.

International Search Report and Written Opinion received for PCT Patent Application No. PCT/US2011/052740, mailed on Jan. 31, 2012, 13 pages.

Bramham, P., "A Convenient Transformer for Matching Co-Axial Lines", CERN European Organization for Nuclear Research, Proton Synchrotron Division, Linac Group, Nov. 1959, 18 pages.

Emerson, D., "The Twelfth-Wave Matching Transformer", printed Feb. 12, 2010, from http://www.tuc.nrao.edu/~demerson/twelfth/twelfth.htm, 4 pages in length—(the full article appeared in QST, vol. 81, No. 6, Jun. 1977, pp. 430-444).

Emerson, Darrel, "Try a Twelfth-Wave Transformer", QST, American Radio Relay League, vol. 81, No. 6, Jun. 1997, pp. 43-44.

Fukuda et al., "A 900/1500/2000-MHz Triple-Band Reconfigurable Power Amplifier Employing RF-MEMS Switches", IEEE,MTT-S International Microwave Symposium, 2005, pp. 657-660.

Liao, Samuel Y., "Balanced Amplifier Design and Power-Combining Techniques", Chapter 5, Microwave Circuit Analysis and Amplifier Design, Prentice-Hall, Inc., Englewood Cliffs, New Jersey, 1987, pp. 160-192.

McDonald, K. T., "Impedance Matching of Transmission Lines", Joseph Henry Laboratories, Princeton University, Princeton, NJ, Jul. 20, 2005, pp. 1-22.

Regier, F. A., "Impedance Matching with a Series Transmission Line Section", Proceedings Letters, Jan. 11, 1971, pp. 1133-1134.

Tombak, Ali, "A Ferroelectric-Capacitor-Based Tunable Matching Network for Quad-Band Cellular Power Amplifiers", IEEE Transactions on Microwave Theory and Techniques, vol. 55, No. 2, Feb. 2007, pp. 370-375.

Wilkinson, Ernest J., "An N-Way Hybrid Power Divider", IEEE Transactions on Microwave Theory and Techniques, Jan. 1960, pp. 311-313.

IMPEDANCE-MATCHING TRANSFORMERS FOR RF DRIVEN $CO_2$ GAS DISCHARGE LASERS

PRIORITY

This application is a divisional of U.S. patent application Ser. No. 12/786,199, filed May 24, 2010, which is incorporated herein by reference.

TECHNICAL FIELD OF THE INVENTION

The present invention relates in general to impedance matching a radio frequency power supply (RFPS) to a load provided by discharge electrodes and related components in a radio frequency (RF) driven $CO_2$ gas discharge laser. The invention relates in particular to impedance matching an RFPS to a load using fractional-wavelength transmission lines in series.

DISCUSSION OF BACKGROUND ART

It is well known the for optimum power transfer from a RFPS to a load an impedance-matching circuit is required. The output power of a $CO_2$ gas discharge laser increases directly with increasing discharge volume. The RF input (load) impedance of the laser varies inversely as the output power and decreases directly as the area of the discharge. The load impedance can vary between lasers within the same model family due to variations in discharge gas pressure, spacing between the electrodes, and other factors An impedance matching circuit may comprise by one or more LC networks consisting of one or more discrete inductors and capacitors, a length of transmission line or coaxial cable having a length which is a selected fraction of a wavelength long, or a plurality of fractional wavelength transmission lines in a selected arrangement.

An example 10A of an impedance-matching circuit including an inductive component and a capacitive component is schematically illustrated in FIG. 1A. Here, an RFPS 12 having an output impedance of 50 Ohms, represented as a resistor $R_S$, is matched to a resistive load $R_L$ of 12 Ohms. In circuit 10A impedance matching is provided by a series inductor L and a parallel capacitor C. Values of L and C would be selected in accordance with the frequency of RFPS 12 as is known in the art. Impedance matching an RFPS in $CO_2$ gas discharge lasers is described in detail in U.S. Pat. No. 7,540,779, assigned to the assignee of the present invention.

One example 10B of a prior-art impedance-matching circuit including a fractional wavelength transmission line is schematically illustrated in FIG. 1B. In this circuit, a transmission line section 14, having a length of one-quarter wavelength ($\lambda/4$) at the frequency of RFPS 12, is placed in series between $R_S$ and $R_L$. $R_S$ and $R_L$ have values 65 Ohms and 50 Ohms respectively. For optimum impedance matching, $\lambda/4$ transmission line 14 has a characteristic impedance of 57 Ohms, i.e., $(R_S * R_L)^{1/2}$, and introduces a phase-shift of 90° ($\pi/2$ radians) between the output of the RFPS and the input to the discharge electrodes.

Another example 10C of a prior-art impedance matching circuit including a fractional wavelength transmission line is schematically illustrated in FIG. 1C. Here there are two $\lambda/4$ transmission lines 14 and 16 in series between $R_S$ and $R_L$. $R_S$ and $R_L$ have values 65 Ohms and 12.5 Ohms respectively. For optimum impedance matching, $\lambda/4$ transmission line 14 has a characteristic impedance of 57 Ohms, and transmission line 16 has a characteristic impedance of 25 Ohms. The series combination of transmission lines introduces a total phase-shift of 180° (it radians) between the output of the RFPS and the input to the discharge electrodes. A detailed description of this and other combinations of fractional transmission line sections for impedance matching is provided in U.S. patent application Ser. No. 12/482,341, filed Jun. 10, 2009, and assigned to the assignee of the present invention.

Yet another example 10D of a prior-art impedance matching circuit including a fractional wavelength transmission line is schematically illustrated in FIG. 1D. Here there are two transmission lines 17 and 19, each thereof having a length of approximately $\lambda/12$ in series between $R_S$ and $R_L$. This scheme is described in detail in a CERN Report NO. 59-37 entitled "*A Convenient Transformer for Matching Co-axial Lines*" dated November 1959 and authored by P. Bramham. A similar arrangement is described in a paper "*The Twelfth-Wave Matching Transformer*", D. Emerson, QST, Vol. 81, no. 6, June 1997, pp. 43-44.

In the twelfth-wave scheme described in the above-reference papers, in order to match a source impedance $Z_S$ to a load impedance $Z_L$ the approximately twelfth-wave transmission line lengths (17 and 19 in FIG. 1D) would have a characteristic impedance of $Z_L$ and $Z_S$, respectively. Only if $Z_S$ were equal to $Z_L$ would the transmission line lengths be exactly $\lambda/12$ (0.083333$\lambda$) long. For practical cases where $Z_S \neq Z_L$, the precise length of the two transmission-line sections are slightly less than an exact twelfth of a wavelength. According to the Emerson paper, the precise electrical length, l, measured in wavelengths for each transmission line is given by an equation:

$$l = \{\text{ArcTan}\,[(B/(B^2+B+1))^{1/2}]\}/2\pi \qquad (1)$$

where the ArcTan value is in radians and $B = Z_S/Z_L$. By way of example, if B were equal to about 4, l would be about 0.0655$\lambda$ instead of 0.0833$\lambda$ or approximately 21% shorter in length than a twelfth of a wave. As B moves closure to unity, the length of the line moves closer to $\lambda/12$ (0.0833$\lambda$).

In the example of FIG. 1D where $Z_S$ and $Z_L$ are 65 and 50 Ohms respectively, i.e., B=1.3, transmission lines 17 and 19 have a length of 0.08056$\lambda$ instead of 0.08333$\lambda$. In this case, the shorter length imposes a 29 degree phase-shift instead of exactly the 30 degrees that would be imposed by a $\lambda/12$ transmission line. Those skilled in the art will recognize that the transmission line lengths referred to above are electrical lengths which include the effect of dielectric constant of insulating material of the transmission lines.

At RFPS frequencies typically used in $CO_2$ gas discharge lasers, for example, between about 40 megahertz (MHz) and about 150 MHz, the size of the discrete LC components in the example of FIG. 1A, is too large, and the length of the $\frac{1}{4}$ wave transmission lines in the examples of FIGS. 1B and 1C are too long to be compatible with modern, solid-state RFPS packaging technology. By way of example, at an RFPS frequency of 100 MHz, the wavelength in free space is 3 meters. Allowing for a velocity factor in the transmission line of 0.66, the physical transmission line length for an electrical length of one-wavelength is still 1.98 meters, resulting in a $\lambda/4$ wavelength line of 0.495 meters, which is still somewhat longer than desirable. The two cascaded (series) $\lambda/12$ lines of the arrangement of FIG. 1D, however, would have a total length of less than $\lambda/6$ wavelength for a physical length of less than about 0.33 meters, which is more practical for solid-state RFPS packaging.

A particular disadvantage of all of the above-described prior-art impedance matching schemes is an inability to easily fine-adjust the impedance matching circuit to compensate for above discussed impedance matching variations between lasers of a particular model or family. If this disadvantage could be eliminated in the arrangement of FIG. 1D, the resulting arrangement would be very useful in the manufacture of families of $CO_2$ gas discharge lasers.

SUMMARY OF THE INVENTION

The present invention is directed to an electrical circuit for optimizing transfer of RF power between a source thereof having a source-frequency and a load. In one aspect, a circuit in accordance with the present invention comprises first and second transmission-line sections each thereof having first and second opposite ends. The first end of the first section is connected to the source. The second end of the first section is connected to the first end of the second section via a node therebetween. The second end of the second section is connected to the load. Each of the first and second transmission-line sections has an electrical length equal to or less than about one-twelfth of a wavelength at the source-frequency. An electrical component having an electrical characteristic is connected to the node between the first and second transmission line sections, with the electrical characteristic being selectively variable for optimizing transfer of the RF power between the source and the load.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1A:
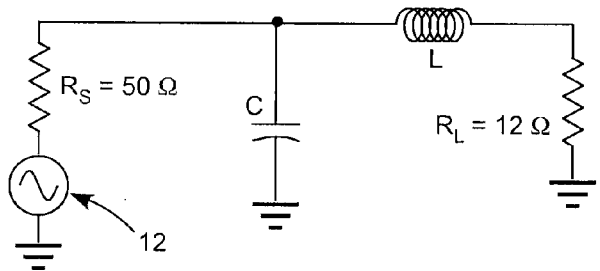
FIG. 1A schematically illustrates a first prior-art circuit for impedance matching an RF source to a load, the circuit including discrete inductive and capacitive components.
Figure 1B:
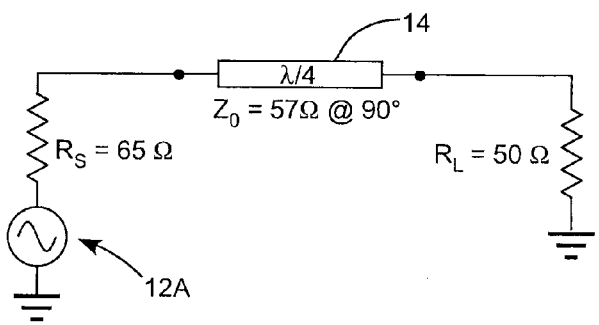
FIG. 1B schematically illustrates a second prior-art circuit for impedance matching an RF source to a load, the circuit including a single length of transmission line, having an electrical length of one-quarter wavelength at the frequency of the source.
Figure 1C:
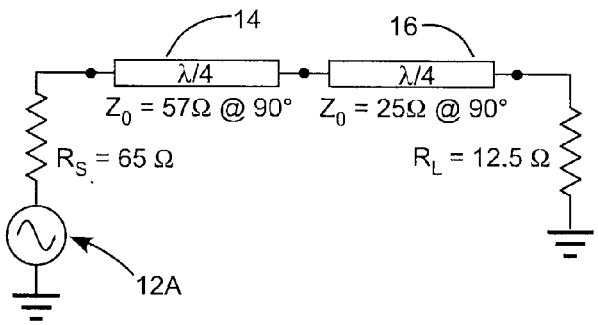
FIG. 1C schematically illustrates a third prior-art circuit for impedance matching an RF source to a load, the circuit including two lengths of transmission line in series each thereof having an electrical length of one-quarter wavelength at the frequency of the source.
Figure 1D:
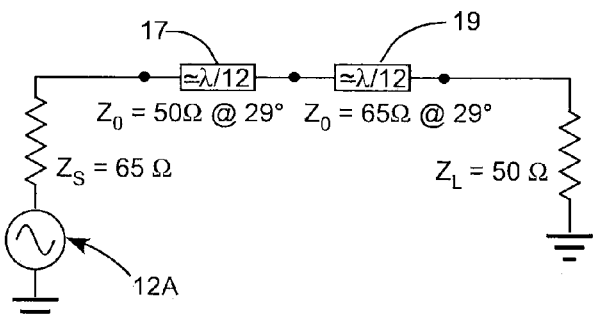
FIG. 1D schematically illustrates a fourth prior-art circuit for impedance matching an RF source to a load, the circuit including two lengths of transmission line in series each thereof having an electrical length of about one-twelfth of a wavelength at the frequency of the source.
Figure 2:
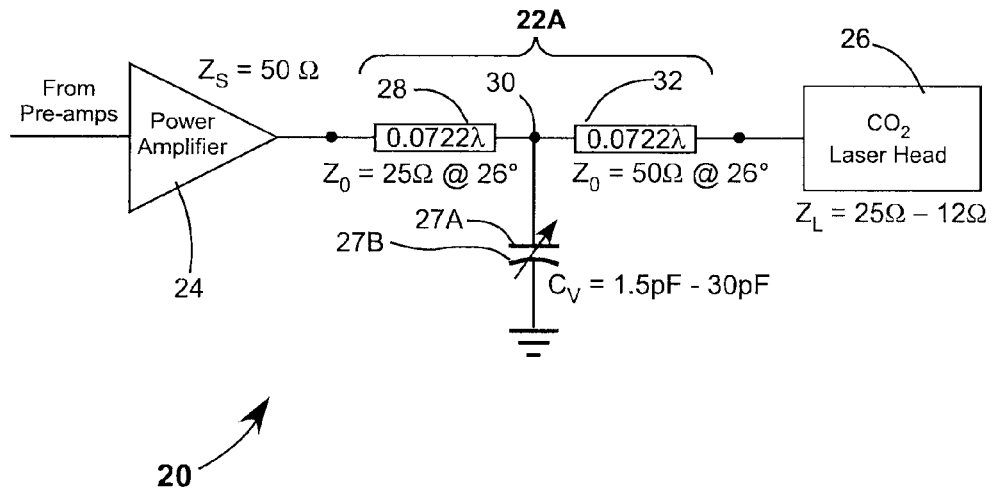
FIG. 2 schematically illustrates one preferred embodiment of a $CO_2$ laser in accordance with the present invention in which impedance matching between an RF source and a laser head is accomplished by a transformer including two lengths of transmission line in series each thereof having an electrical length of less than one-twelfth wavelength at the frequency of the source with a node therebetween shunted to ground via a variable capacitor for varying the output impedance of the transformer to match that of the laser head.

Referring now to the drawings, wherein like components are designated by like reference numerals, FIG. 2 schematically illustrates of one preferred embodiment 20 of a $CO_2$ laser including one example 22A of a variable impedance matching transformer in accordance with the present invention.

A power amplifier 24 is the final amplification stage of an RF power supply (RFPS) including an RF oscillator (not shown) the output of which is amplified by a series of preamplifiers (also not shown) and then power amplifier 24. The output of the power amplifier, i.e., the output of the RFPS, is delivered to a $CO_2$ laser head 26 via impedance matching transformer 22A. Laser head 26 includes an enclosure in which are located discharge electrodes and a lasing gas mixture (not shown) as is known in the art. Here it is assumed that power amplifier 24 has an impedance $Z_S$ equal to 50 Ohms, and that the laser head has an impedance $Z_L$, which can have any value between 25 Ohms ($Z_{MAX}$) and 12 Ohms ($Z_{MIN}$).

Transformer 22A includes two lengths of transmission line 28 and 32, each of which has the same electrical length. That length is less than one-twelfth of a wavelength (0.0833λ) at the frequency of the RFPS. In this example, the transmission line length is about 0.0722λ and each length imposes a phase shift of 26° on a transmitted wave. A variable shunt-capacitor $C_V$ has one plate 27A thereof connected to a node 30, between transmission lines 28 and 32 and the opposite plate 27B connected to ground. In this example, the value of $C_V$ can be varied between 1.5 picofarads (pF) and 30 pF to match any impedance in the range between 25 Ohms and 12 Ohms. Such a range of load impedances is representative of diffusion cooled slab $CO_2$ laser having output power between about 70 Watts (W) and 250 W, respectfully. For a laser manufacturer, being able to cover such a range of laser output-powers with one transmission-line length reduces parts inventory in the manufacturing process.

The length of the transmission lines sections is determined by an equation $$l = \{\text{ArcTan}\,[(A/(A^2+A+1))^{1/2}]\}/2\pi \quad (1)$$

where the ArcTan value is in radians and $A=Z_S/(Z_{MAX}*Z_{MIN})^{1/2}$.

Figure 3:
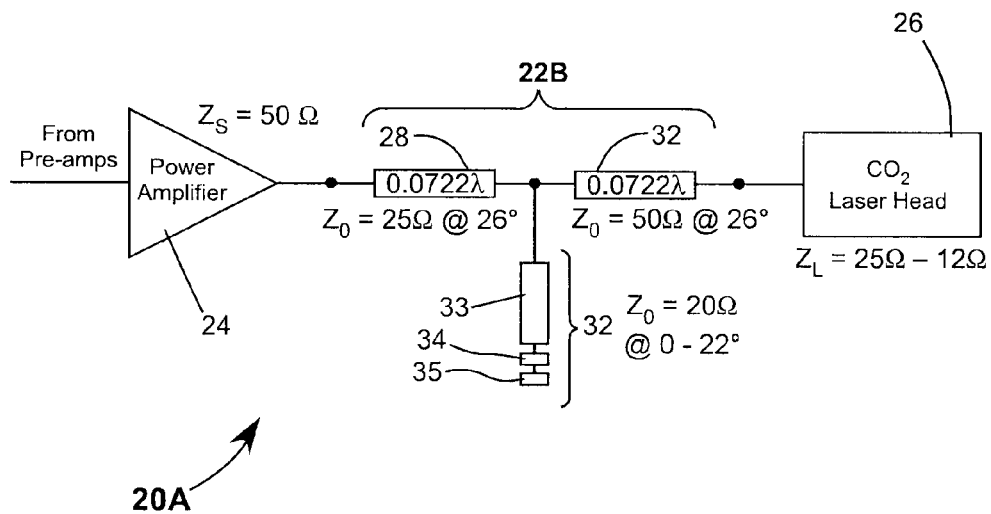
FIG. 3 schematically illustrates another preferred embodiment of a $CO_2$ laser in accordance with the present invention similar to the laser of FIG. 2 but wherein in the impedance-matching transformer the variable capacitor of FIG. 2 is replaced by a third length of transmission line having incrementally variable length for varying the output impedance of the transformer to match that of the laser head.

FIG. 3 schematically illustrates another preferred embodiment 20A of a $CO_2$ laser in accordance with the present invention. Laser 20A is similar to laser 20 of FIG. 2, with an exception that variable impedance transformer 22A of laser 20 is replaced in laser 20A by a variable impedance transformer 22B. Variable impedance transformer 22B is similar to variable impedance transformer 22A with an exception that variable capacitor $C_V$ is replaced in transformer 22B by an open-ended transmission-line shunt or stub 32 of incrementally variable length. The variability here is achieved by forming transmission line 32 from a plurality of sections, here designated 33, 34 and 35. In this example all of the sections have a characteristic impedance of 20.0 Ohms and the length can be varied from zero to 0.0611λ, i.e., zero to 22° in phase terms. If the stub has zero length, then transformer 22B matches a 25 Ohm load. If a length of 22° is used for the stub length, transformer 22B matches a 12 Ohm load. Intermediate impedance values are achieved by different intermediate lengths of the transmission-line stub.

In embodiments of the present invention discussed above, a transformer is provided between a source and a load in which the magnitude of the output impedance can be varied to match some particular load impedance. It is also possible to construct a transformer in accordance with the present invention in which the magnitude of the impedance is fixed, but the output phase of the transformer is variable.

Figure 4:
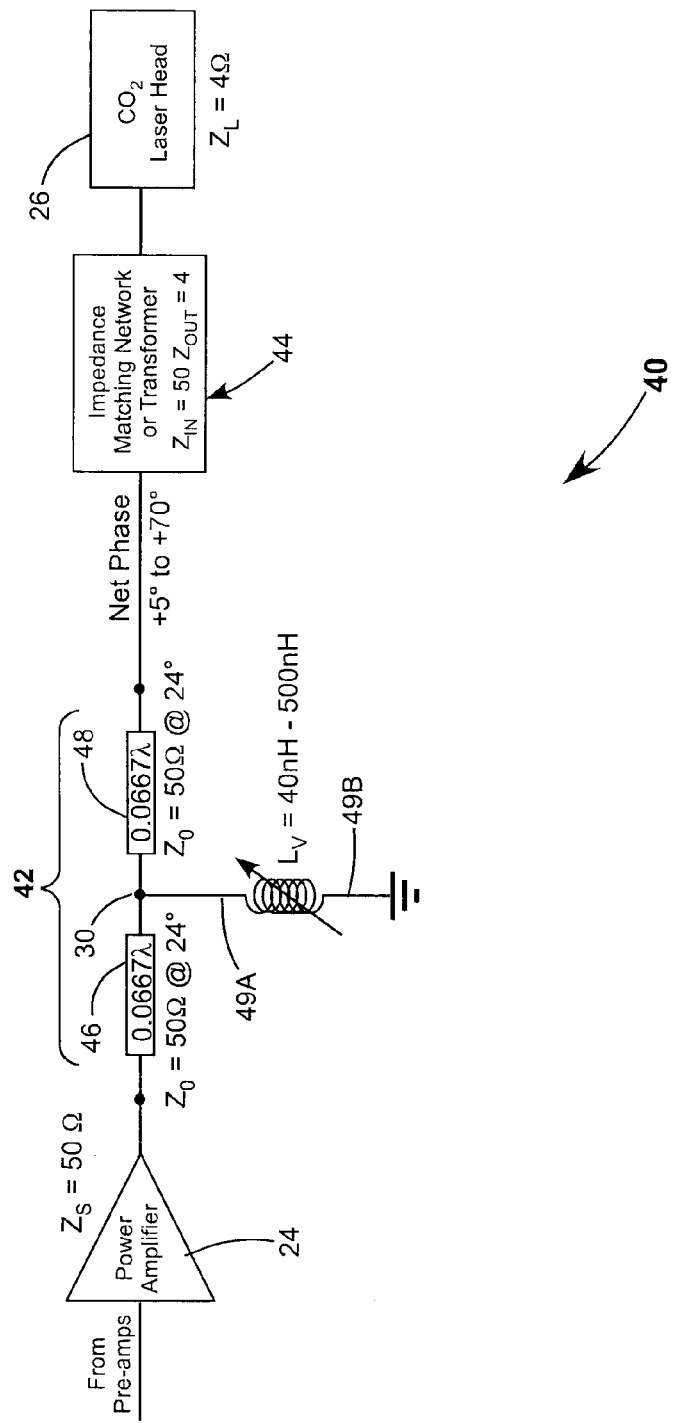
FIG. 4 schematically illustrates yet another preferred embodiment of a $CO_2$ laser in accordance with the present invention in which impedance matching between an RF source and a laser head is accomplished by a transformer and an impedance matching network, the transformer including two lengths of transmission line in series each thereof having an electrical length of less than one-twelfth wavelength at the frequency of the source with a node therebetween shunted to ground via a variable inductance for varying the output phase of the transformer to optimize transmission to the impedance matching network.

By way of example FIG. 4 schematically illustrates yet another embodiment 40 of a laser in accordance with the present invention in which RF power from an RF power supply, represented by power amplifier 24, is delivered to a $CO_2$ laser head 26 via a variable-phase transformer 42 in accordance with the present invention and a fixed impedance matching network or transformer 44. Here, the power amplifier has a source impedance $Z_S$ of 50 Ohms and the laser head has a load impedance $Z_L$ of 4 Ohms. Such a low impedance is characteristic of high-power diffusion-cooled slab $CO_2$ lasers have a large discharge area. Impedances less than 2 Ohms or less are experienced in $CO_2$ diffusion-cooled slab lasers having about 1000 W or more of output power.

The input impedance of impedance-matching network 44 is 50 Ohms which is the same as the source impedance of amplifier 24. Transformer 44 includes two lengths of transmission line 46 and 48 each having a characteristic impedance of 50 Ohms. Each has an electrical length of 0.0667λ, i.e., λ/15, or 24° in phase terms. Phase variability is provided by a variable inductance $L_V$ having one end 49A thereof connected to node 30 between the lengths of transmission line and opposite end 49B thereof connected to ground. Varying $L_V$ between 40 nanohenries (nH) and 500 nH varies the phase-shift imposed by transformer 42 between +5° and +70°. This variability can be used to optimize power by cancelling any phase shift introduced in the impedance-magnitude matching network 44.

Those skilled in the art will recognize without further detailed description or illustration that fixed impedance-matching network 44 in laser 40 could be replaced with any above-described or other embodiment of a variable impedance transformer in accordance with the present invention. This would provide a manufacturer with independent control of both the impedance-magnitude and phase of RF power at the laser head.

In the embodiments of FIGS. 2, 3, and 4 described above, the value range for the electrical components shunting the two lengths of transmission line was calculated by setting up the circuit theoretically on a Smith chart. Values indicated from the Smith Chart were then refined by circuit-simulation software PSpice® available from Cadence® Inc. of San Jose, Calif. Alternatively the Smith chart evaluation could be omitted and the values determined by simulating the appropriate circuit on a more comprehensive circuit-simulation software such as ADS available from Agilent Technologies, of Santa Clara, Calif. In the embodiment of FIG. 4, this circuit refinement recommended lengths for the two lengths of transmission line different from those which would have been predicted by equation (2).

Figure 6:
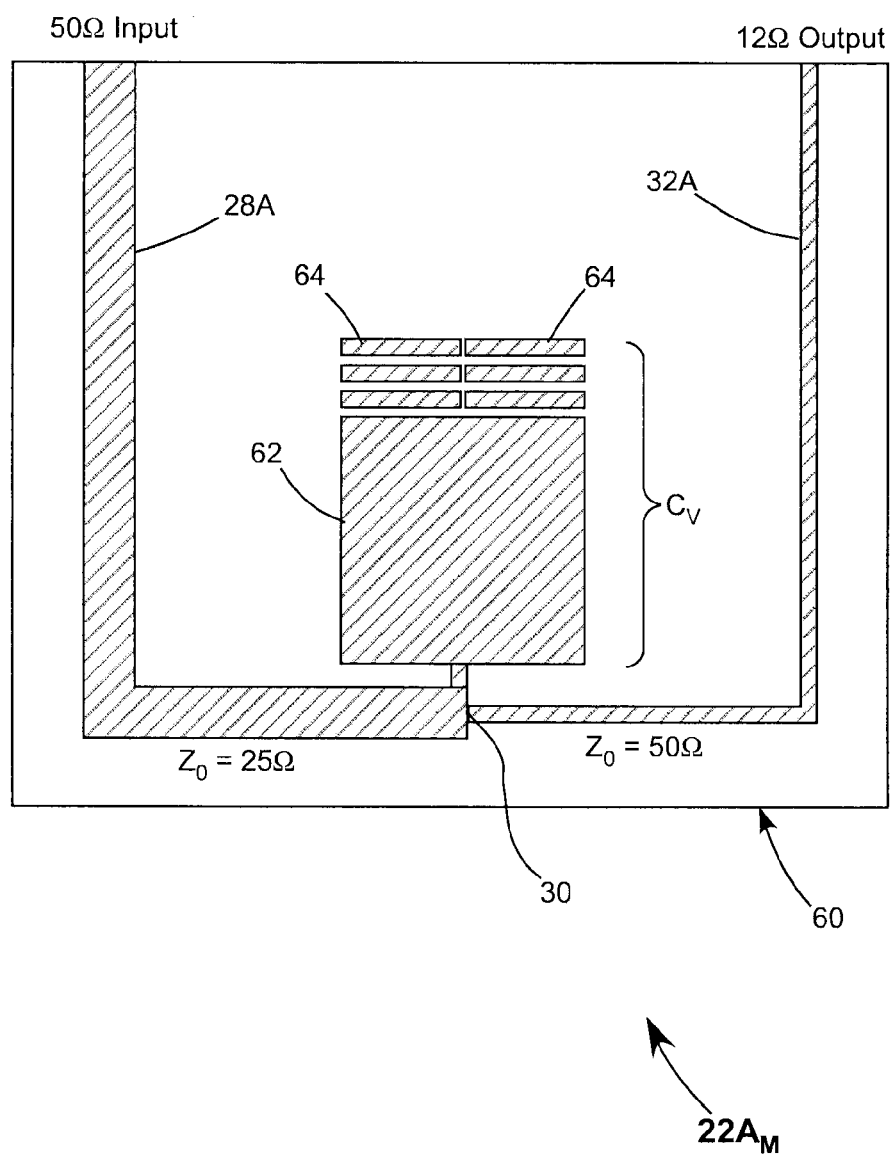
FIG. 6 is a plan view schematically illustrating a microstrip implementation of the variable impedance matching transformer of FIG. 2 on an alumina substrate FIG. 7 schematically illustrates one preferred embodiment of an RF power supply in accordance with the present invention including an RF oscillator the output of which is amplified in sequence by a preamplifier a driver amplifier and a power amplifier, and wherein the variable impedance matching transformer of FIG. 6 is used to impedance match the output impedance of the driver amplifier to the input impedance of the power amplifier.

The final value for the electrical shunting component would typically be determined during the process of assembling the laser. This adjustment can be based on actual measurements of the associated components or through trial and error testing. For example, during set up, the capacitance of the variable capacitor in the transformer 22A can be increased or decreased. Where the capacitor is formed from a strip as shown in FIG. 6 discussed below, adjustments to the value of the capacitor can be made by etching away links between capacitor segments or by soldering bridges between segments of the capacitor to form new links.

Figure 5:
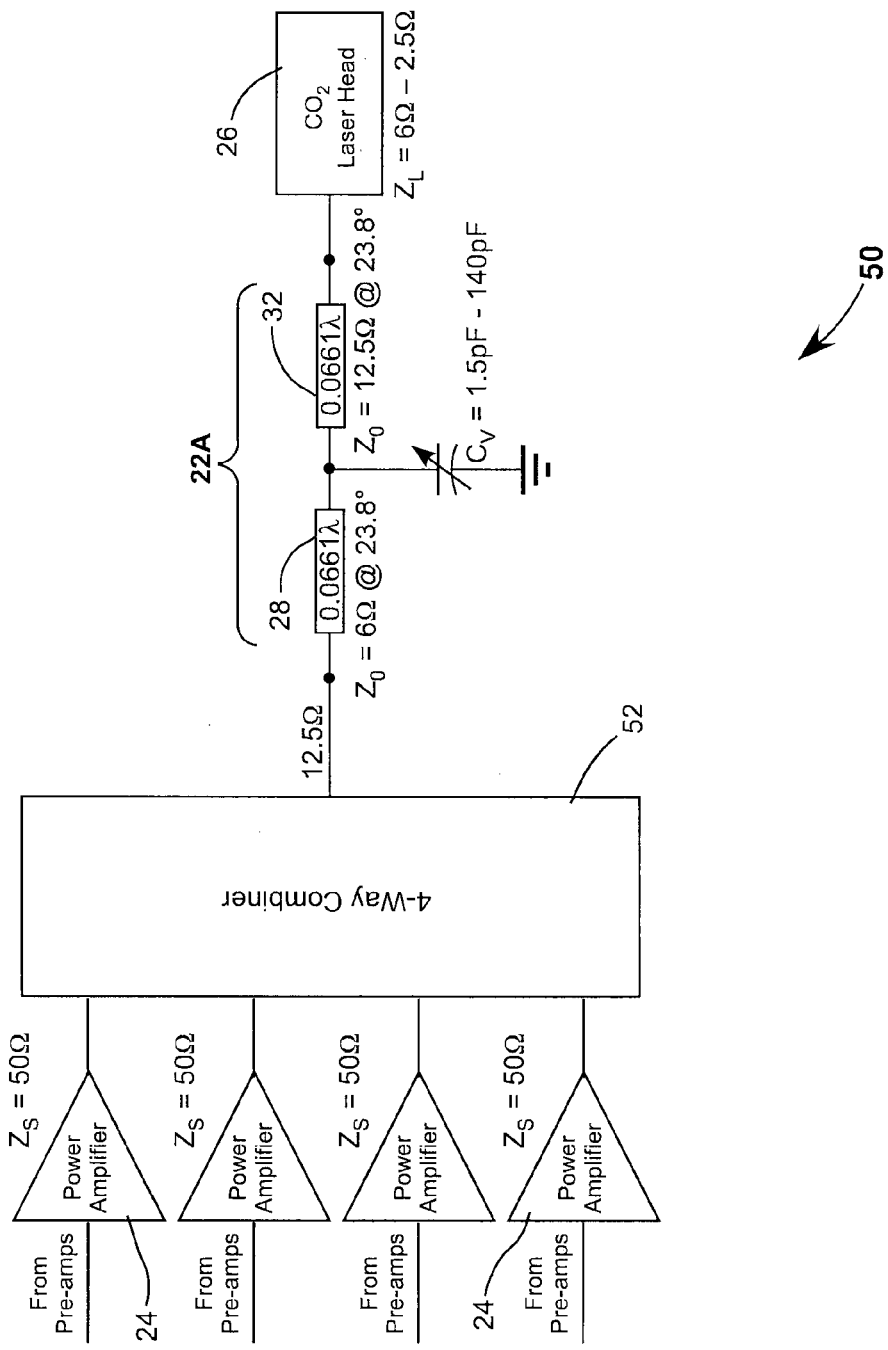
FIG. 5 schematically illustrates still another preferred embodiment of a $CO_2$ laser in accordance with the present invention similar to the laser of FIG. 2 but wherein the RF source includes four power amplifiers the outputs of which are combined by a power combiner, with the transformer matching the impedance of the power combiner to the impedance of the laser head

In high-power $CO_2$ lasers, final power amplification is often performed by dividing the output of a pre-amplifier stage into parallel channels each including a power amplifier, the combining the outputs of the power amplifiers with a power combiner. FIG. 5 schematically illustrates still another embodiment 50 of a $CO_2$ laser including a variable impedance transformer in accordance with the present invention. Laser 50 is similar to laser 20 of FIG. 2 with an exception that RF power for the laser head is supplied from a power combiner 52 which combines the outputs of four power amplifiers 24 as discussed above. Power combiners are well known in the art and a detailed description thereof is not necessary for understanding principles of the present invention. A detailed description of such combiners is provided in U.S Pre-grant publication No. 2008/0204134, assigned to the assignee of the present invention and the complete disclosure of which is hereby incorporated by reference.

As each of the power amplifiers has a source impedance of 50 Ohms, the effective impedance of the combiner is 12.5 Ohms. Laser head 26 in this embodiment is assumed to be of the high power type discussed above and can have a load-impedance between 6 Ohms and 2.5 Ohms. The values of components of transformer 22A in laser 50 are changed from the values of transformer 22A in laser 20 for this reason. Here, transmission-line sections 26 and 28 have characteristic impedances $Z_o$ of 6 Ohms and 12.5 Ohms, respectively, and each has a length of 0.0661λ (23.8° in phase terms). The upper capacitance limit of capacitor $C_V$ is increased from 30 pF to 140 pF.

In any of the above described impedance-magnitude or phase-variable transformers, transmission-line sections could be lengths of co-axial cable or some other form of transmission line such parallel-pair or micro-strip transmission lines. Micro-strip lines are particularly compatible with modern solid-state RF packaging technology. A description of a micro-strip implementation of transformer similar to transformer 22A of FIG. 2, but designed for tuning between 9 Ohms and 12 Ohms, is set forth below with reference to FIG. 6.

Here, variable impedance transformer 22A is printed on one side (shown) of an alumina substrate 60 having a thickness of 0.06 inches. The transformer is designated by a reference numeral $22A_M$ to reflect the micro-strip implementation thereof. The opposite side would be metalized to provide a ground connection. The substrate measures 3.2 inches by 2.7 inches. It is assumed that the input frequency to the transformer transformed is 100 MHz. Each of transmission lines 28A and 32A has an electrical length of 0.0622λ, i.e., 23° in phase-terms. The physical lengths of lines 28A and 32A are 2.8 inches and 3.0 inches respectively. Line 28A has a width of 0.186 inches providing a characteristic impedance of 25 Ohms. Line 32A has a width of 0.057 inches providing a characteristic impedance of 50 Ohms.

Variable capacitor $C_V$, here, comprises a primary printed capacitor 62 and additional discrete printed capacitor elements 64. Capacitor 62 has dimensions 0.9 inches by 0.9 inches providing a capacitance of 30 pF. The additional discrete capacitors have dimensions 0.49 inches by 0.125 inches and each have a capacitance of 2.5 pF. Electrically connecting one or more of discrete printed capacitors 64 to primary printed 30 pF capacitor 62 enables the net capacitance of $C_V$ to be incrementally adjusted from 30 pF to 45 pF to adjust the output impedance from 12 Ohms to 9 Ohms. In deploying the transformer one side of the capacitors 62 and 64 would be connected to ground via the metalized (not shown) surface. If primary capacitor 62 and associated discrete capacitors were incorporated in a separate discrete high-power capacitor with suitable line impedances, the output impedance could be made incrementally adjustable over a range from 12 Ohms to 2.5 Ohms.

As discussed above, RF power supplies for high power $CO_2$ lasers usually include cascaded amplifiers incrementally amplifying the output of an RF oscillator. In a final stage the amplified RF can be divided into parallel channels each including a power amplifier with the outputs of the power outputs being recombined by a power combiner. In such amplifier arrangements, amplifier stages are usually cascaded without an adjustment capability for precisely matching impedances between the modules. Such impedance-matching adjustment between stages is not usually performed, because performing the match with prior-art technology is too time-consuming. Such a lack of impedance-matching adjustment results in a distribution of impedance mismatches between the transistor modules. This, in turn, results in a difference in output power between the modules. This difference in output power between the stages stresses the stages and causes a decrease in RF output efficiency because of power losses within the power combiner.

The convenient size and ease of impedance adjustment makes a variable impedance transformer configured according to arrangement of FIG. 6 useful for adjusting impedance matching between amplifier stages. A description of such inter-stage impedance-matching is set forth below with reference to FIG. 7

Figure 7:
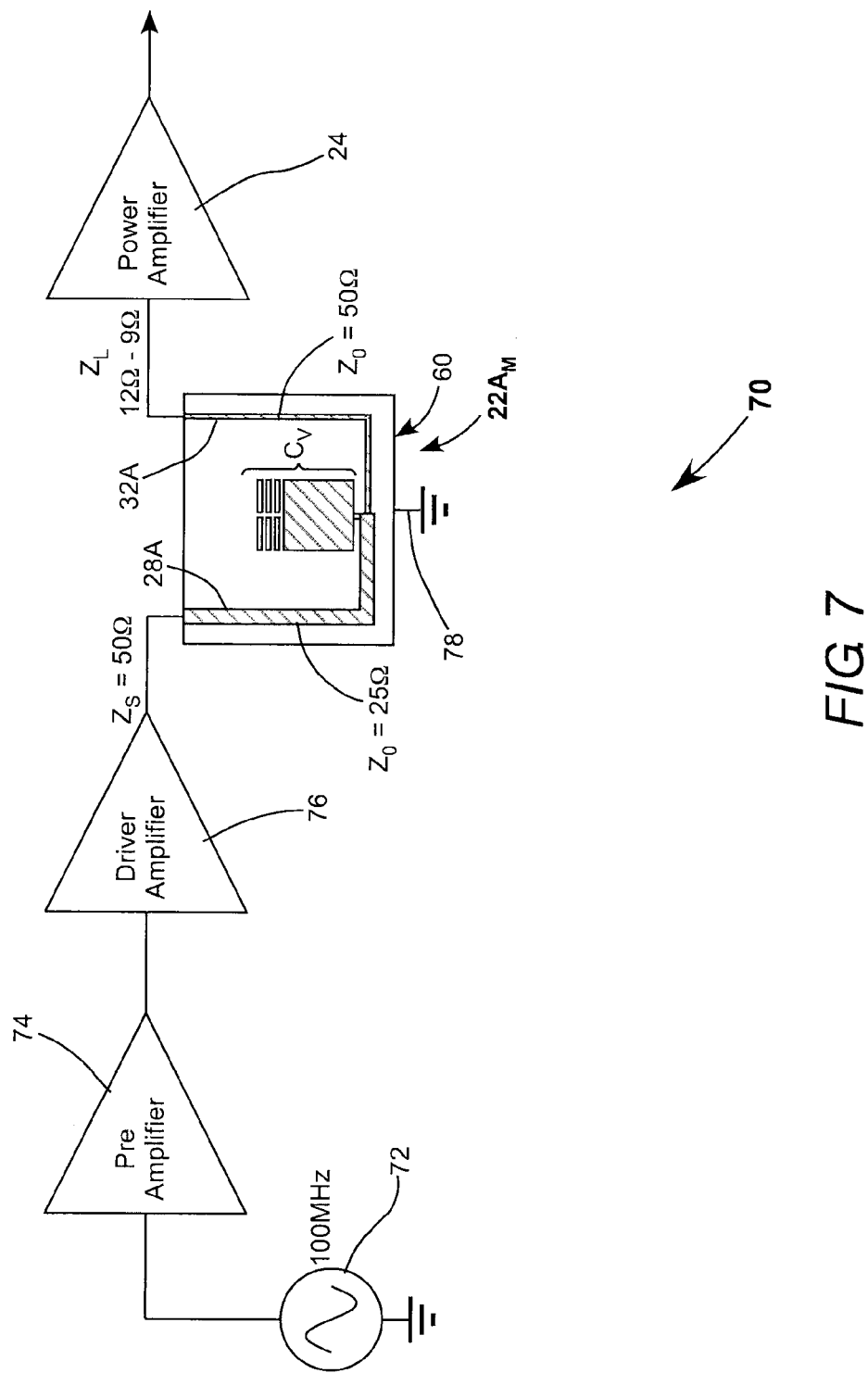

Here, an RFPS 70 includes a 100 MHz RF oscillator 72, the output of which is sequentially amplified by a preamplifier 74, a driver amplifier 76, and a power amplifier 24. The power amplifier, here, is designated by the same reference numeral as in above-described embodiments of the present invention for consistency of description but can be considered the "load" in this embodiment. Only one preamplifier stage is depicted in FIG. 7 for simplicity of illustration. In practice, there would usually be more than one preamplifier, with the number of preamplifiers dependent on the power required to operate the driver and power amplifiers in a saturation mode for high efficiency. Here, the output power of the driver amplifier is considered sufficiently high that impedance matching between the driver amplifier and the power amplifier is justified to obtain efficient operation of the RFPS. Impedance matching is provided by transformer $24A_M$ of FIG. 6. Incrementally-variable capacitor $C_V$ is grounded by connection 78.

In embodiments of the present invention described above two transmission-line sections are connected in series. An electrical component having an electrical characteristic is connected to the node between the two transmission-line sections, with the electrical characteristic being selectively variable for optimizing transfer of the RF power between the source and the load. Those skilled in the art will recognize without further detailed description or illustration that a single electrical component could be replaced by a combination of similar components arranged to provide the same electrical characteristic. By way of example, a single transmission line section could be replaced by a parallel pair of sections, or a single capacitor could be replaced by a parallel pair of capacitors. Any such combinations can be made without departing from the spirit and scope of the present invention.

In summary the present invention is described above with reference to a preferred and other embodiments. The invention, however, is not limited to the embodiments described and depicted, herein. Rather the invention is limited only by the claims appended hereto.

What is claimed is:

1. A method of optimizing the performance of a gas laser, said gas laser being driven by RF power source and wherein the load associated with the laser is unknown, said method comprising the steps of:

providing an electrical connection between the power source and the laser, said connection including first and second transmission-line sections each thereof having first and second opposite ends, with the first end of the first section being connected to the source, the second end of the first section being connected to the first end of the second section via a node therebetween, and the second end of the second section being connected to the load, with each of the first and second transmission-line sections having an electrical length equal to or less than about one-twelfth of a wavelength at the source-frequency, said connection including an electrical component having an electrical characteristic connected to the node between the first and second transmission-line sections, with the electrical characteristic of the component being selectively variable; and varying the electrical characteristic of the component while operating the laser to find the value for the component that optimizes the transfer of the power between the source and the laser.

2. The method of claim 1, wherein the electrical component is a capacitor having a selectively variable capacitance.

3. The method of claim 2, wherein the capacitor has first and second opposite plates with the first plate being connected to the node between the first and second transmission-line sections and the second plate being connected to ground.

4. The method of claim 2, wherein the electrical connection has an output impedance and varying the capacitance of the capacitor varies the output-impedance of the electrical connection.

5. The method of claim 2, wherein the impedance of the laser has a value between a maximum anticipated value and a minimum anticipated value and the capacitance of the capacitor is variable between a minimum value and a maximum value, wherein the characteristic impedance of the first transmission-line section is about equal to the maximum anticipated value of the laser impedance, the characteristic impedance of the second transmission-line section is about equal to the impedance of the power source, and wherein varying the capacitance of the capacitor between the minimum and maximum values thereof varies the output impedance of the circuit between the maximum and minimum values, respectively, thereof.

6. The method of claim 5, wherein the impedance of the source is 50 Ohms, the maximum and minimum values of impedance of the laser are 25 Ohms and 12 Ohms respectively, the minimum and maximum capacitance values of the capacitor are about 1.5 picofarads and about 30 picofarads respectively.

7. The method of claim 1, wherein the electrical component is a third transmission-line section having first and second opposite ends and a selectively variable electrical-length.

8. The method of claim 7, wherein the first end of the third transmission-line section is connected to the node between the first and second transmission-line sections and the second end of the third transmission-line section is open.

9. The method of claim 7, wherein the electrical length of the third transmission line section is less than about one-twelfth of a wavelength at the source frequency.

10. The method of claim 7, wherein the electrical connection has an output impedance and varying the electrical-length of the third transmission line section varies the output impedance of the electrical connection.

11. The method of claim 1, wherein the electrical component is an inductor having a selectively variable inductance.

12. The method of claim 11, wherein the inductor has first and second opposite ends the first end being connected to the node between the first and second transmission line sections and the second end being connected to ground.

13. The method of claim 11, wherein the electrical connection imposes a phase-shift on the RF power delivered by the source and varying the inductance of the inductor varies the phase-shift imposed by the electrical connection.

* * * * *